United States Patent [19]
Morzano

[11] Patent Number: 5,666,390
[45] Date of Patent: Sep. 9, 1997

[54] HIGH SPEED PROGRAMMABLE COUNTER

[75] Inventor: Christopher K. Morzano, Boise, Id.

[73] Assignee: Micron Technology, Inc., Boise, Id.

[21] Appl. No.: 535,655

[22] Filed: Sep. 28, 1995

[51] Int. Cl.$^6$ ................................................. H03K 23/66
[52] U.S. Cl. ............................. 377/52; 377/51; 377/110
[58] Field of Search ........................... 377/52, 51, 27, 377/110

[56] References Cited

U.S. PATENT DOCUMENTS 3,878,510  4/1975  Smith ........................... 340/147 R

*Primary Examiner*—Margaret Rose Wambach
*Attorney, Agent, or Firm*—Schwegman, Lundberg, Woessner & Kluth, P.A.

[57] ABSTRACT

A digital counter allows the provision of start and stop values in order to allow it to be configurable to any length. The counter rolls over to zero at a maximum value and proceeds to count until it reaches an indicated stop count. At that point, it proceeds to the start count and continues counting. The counter counts half bytes of a cell of data for transmission to and from a multiport DRAM in accordance with communication protocols, such as asynchronous transfer mode (ATM.).

9 Claims, 12 Drawing Sheets

HIGH SPEED PROGRAMMABLE COUNTER

FIELD OF THE INVENTION

The present invention relates to a programmable counter and more specifically to a counter with programmable start and stop counts.

REFERENCE TO RELATED APPLICATIONS

A copending application entitled "Self-Queuing Serial Output Port" filed on the same date herewith is assigned to the same assignee as the present application and is incorporated herein by reference.

BACKGROUND OF THE INVENTION

Asynchronous Transfer Mode (ATM) communication switches have multiple output ports to perform high speed switching of multibyte cells of data. The switches are generally formed with a shared memory for buffering multiple cells of data, and several ports coupled to the memory for transferring data between the memory and busses or channels attached to the switch. Counters are used to provide a running total of how many bytes or nibbles (half bytes) of a cell have been transferred. In addition, there are countless uses for counters deep inside semiconductor chips used for executing instructions in computers and assisting with basic electronic circuit functions. Many of the counters are specifically designed for each intended purpose. This leads to extra effort in modifying each design to count to a specific number, and provide functions to start, stop, continue and reset the count. When counters are used to help implement communication protocols such as ATM, there may be different lengths of cells for which each byte of the message must be counted. A different set of counters may be needed for each message length, increasing design cost and complexity. There is a need for a flexible counter than can handle different length cells without the need for reprogramming.

SUMMARY OF THE INVENTION

A digital counter allows the provision of start and stop addresses in order to allow it to be configurable to any length, and to start and stop at desired positions in a cell of data. This provides a robust design that can easily be utilized in a larger circuit with little or no modification, minimizing design cost and complexity. In one embodiment, the counter rolls over to 0 after reaching a maximum value of 112. The counter counts to 111 and then goes back to 0, continuing to count until it reaches an indicated stop count. At that point, it proceeds to the start count and continues counting. In this manner, the start count value may actually be higher than the stop count because the counter will just roll over and being counting at 0 until it reached the stop count.

In a further embodiment, the counter is used to identify the length of message packets or cells being processed in accordance with a communication protocol such as ATM (asynchronous transfer mode). The counter start and stop addresses are variably set in accordance with the number of bytes of data in each cell which is being transferred to and from memory and a bus or channel. With a roll over value of 112, and data being transferred in nibbles of four bits, an entire 56 byte ATM cell may be counted without resetting the counter. Cells of shorter length may also be counted without having to intervene to reset the counter, or providing a separate counter for each cell length.

BRIEF DESCRIPTION OF THE DRAWINGS

FIG. 5b is a continuation of the schematic diagram of FIG. 5a;

DESCRIPTION OF THE PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present inventions. The following detailed description is, therefore, not to be taken in a limiting sense, and the scope of the present invention is defined by the appended claims.

Numbering in the Figures is usually done with the hundreds and thousands digits corresponding to the figure number, with the exception that the same components may appear in multiple figures. Signals and connections may be referred to by the same number or label, and the actual meaning should be clear from the context of use.

GENERAL ATM SWITCH OPERATION

Figure 1:
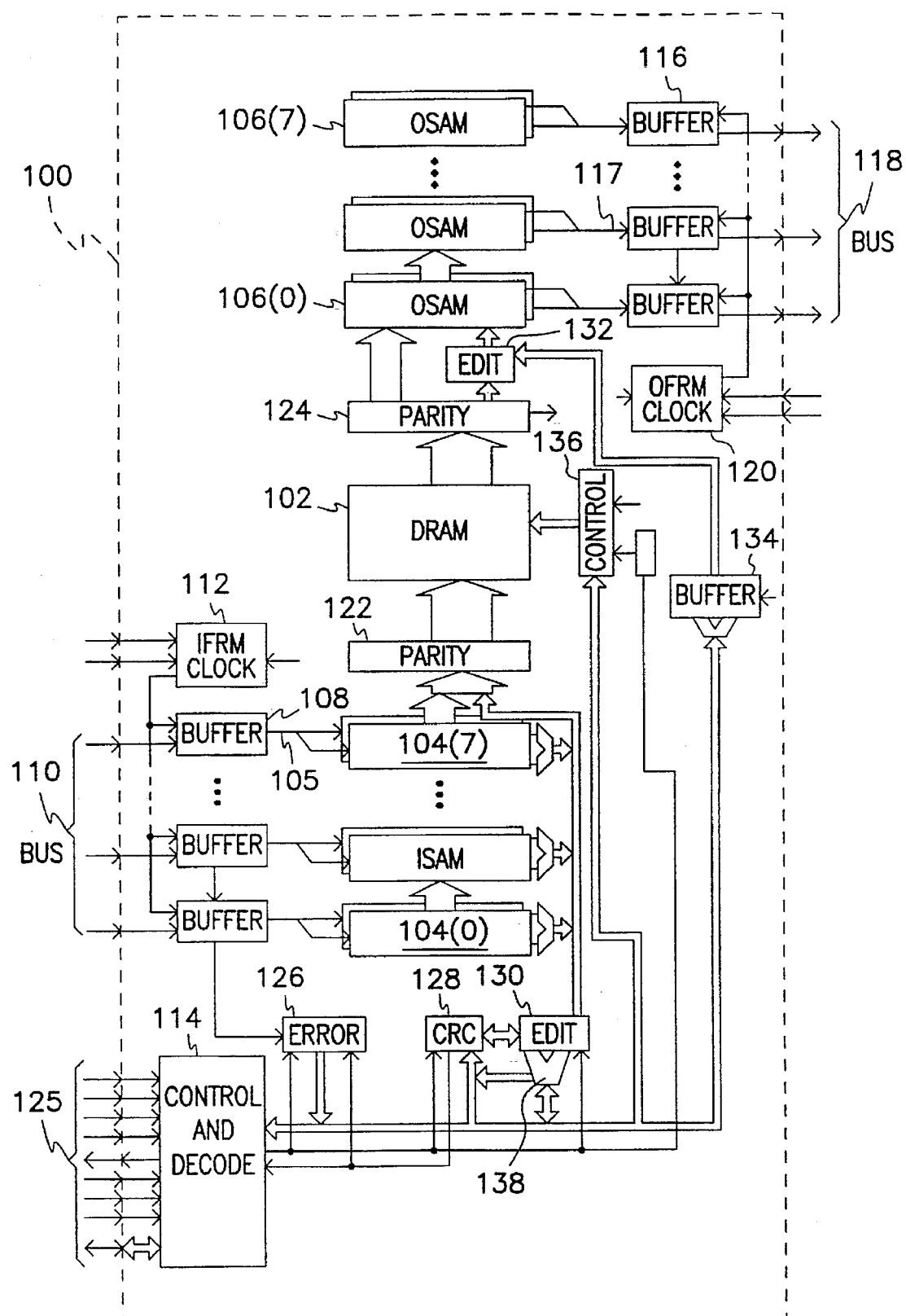
FIG. 1 is a detailed block diagram of a multi-port memory switch for buffering ATM cells in accordance with the present invention.

The present invention is described as being incorporated in a multi-port memory. A detailed block diagram of the multi-port memory is indicated generally at 100 in FIG. 1. A dynamic random access memory (DRAM) 102 and eight double-buffered input ports comprising serial access memories (SAMs) 104(0)–(7). The eight output ports comprising SAMs 106(0)–(7) are also double-buffered. The input SAM's accept back-to-back ATM cells from a bus or channel that may be any medium capable of handling digital data in conformance with ATM standards. Medium from optical fiber, copper wire, wireless electromagnetic transmissions and any other medium with suitable transformation devices to convert signals to be compatible with the embodiments of the present application described herein may be used. Double buffering allows one full ATM cell to be moved into the DRAM from an input port while a second ATM cell is being loaded into the input port. Likewise, the output SAM's in one embodiment output one ATM cell on a 4-bit data bus while a second ATM cell is being transferred to the output port from the DRAM.

ATM cells flow through input ports into the input SAM's where editing can be performed. The ATM cells are transferred to the DRAM and then transferred to the output SAM's where further editing can be performed.

Each input port has a corresponding buffer circuit 108. The buffer circuits 108 are used to perform several functions including latch and buffer input data, queue nibble counter, and pointer decoder and control. Four-bit input data communication bus lines 110 provide ATM cell input to the buffer circuits 108. An input frame and clock circuit 112 connected to the buffer circuits both denotes the beginning of an input cell and synchronizes the input data.

Each output SAM 106 has a corresponding buffer circuit 116. The buffer circuit 116 is used to perform several functions including latch and buffer output data, queue nibble counter, and pointer decoder and control. Four-bit output communication bus lines 118 provide ATM cell output from buffer circuits 116. An output frame and clock circuit 120 connected to the output buffer circuits denote the beginning of an output cell and synchronizes the output data.

Byte parity generator 122 provides a parity code for each ATM cell transferred to the DRAM from an input SAM 104, and byte parity check 124 checks the parity of an ATM cell transferred from the DRAM to an output SAM 106.

Control interface and command decode 114 interfaces the multi-port memory 100 with an external controller which selects which switch may next transmit cells on an output port and decodes commands provided on interface lines 125 therefrom. Error/status circuit 126 monitors the status of the input SAM's 104 to determine if a transfer to the DRAM is needed and tracks the output from the byte parity check 124 to determine if an error occurred. Cyclical redundancy check (CRC) logic 128 and edit buffer control 130 together provide a means of modifying the ATM cell prior to transferring it from an input SAM port 104 to the DRAM, as described below. An output editor 132 and output edit buffer 134 allow for the modification of the ATM cell prior to outputting through the output SAMs 106. Memory control circuit 136 provides the circuitry needed to address the DRAM as known by one skilled in the art.

ATM DATA FLOW

ATM cells flow through the buffer circuits 108 into the input serial access memory (ISAM) 104 where editing can be done by an external control function provided through the control interface. The external control function instructs the chip when to store ISAM cells in the DRAM 102 and when to load the output serial access memory ports (OSAM) 106 from the memory 102. The OSAMs deliver the ATM cells to output buffers 116 for dispatch. The following paragraphs describe the data flow in more detail.

ATM cells enter the chip through communication line inputs 110 to the input buffers 108. The 4-bit parallel stream is loaded into an ISAM 104 by the clock associated with the buffers over 4-bit data bus 105. The input frame and clock circuit 112, marking the first data nibble of the ATM cell, is used to start the ISAM load. Once a complete cell has been loaded into an ISAM, the error/status circuit 126 sets a "ISAM full" status bit. As noted above, the ISAMs are two ATM cells long, so the next ATM cell can continue to stream into the ISAM. An asynchronous, external control function polls the ISAM status through the control interface and command decode 114. Once an ISAM full status is detected by the external controller through the control interface and command decode 114, the first 72 bits of the ISAM are copied to the input edit buffer 130 and the first or second word of the ISAM can be output to the external controller using mux 138. The external controller evaluates and optionally modifies the word and then initiates a write to the DRAM moving the content of the input edit buffer (bits 0–71) and the remaining content of the ISAM (bits 72–447) over a write transfer bus to the DRAM row specified by an address presented through the memory logic control 136. The ISAM full status is cleared when the ISAM is transferred. The first and/or second word of the input edit buffer 130 can be returned by the external controller to modify the content of the ISAM.

The external controller polls an output port status through the control interface and command decode 114 for empty OSAMs. Once all OSAMs 106 coupled to the same output channel are empty or there is only one currently transferring a cell, a DRAM read is initiated to move data at a DRAM row specified by an address from the memory control 136 over a read transfer bus to the OSAM. The first or second word of the ATM cell can be edited by output edit register 132. Like a write transfer, the transfer to an OSAM clears the empty OSAM status. OSAMs are double buffered, and similar to the ISAMs can continuously stream data out of the output buffers 116. The 4-bit parallel stream is clocked over 4-bit data bus 117 by the clock associated with the output buffers 116 by output frame and clock circuit 120.

The multi-port memory stores ATM cells of 56 bytes in the internal DRAM 102. The standard ATM cell consists of 4 bytes of header, 48 bytes of data, and one byte of header-error-check. The header-error-check is typically a cyclical redundancy check (CRC) code, which is used on communication links and may or may not be presented to the multi-port memory. The remaining space, either 3 or 4 bytes depending on the presence of the CRC, can be used to store specialized routing information for space-division switches, specialized error control information, or any other purpose. These additional bytes are referred to herein as "prepend/postpend" data, and the number of bytes of each is configurable. The prepend/postpend data can be generated, read, written, and stripped through cell editing operations.

The input edit buffer 130, in concert with the CRC circuitry 128, provides a means to modify the ATM cell captured in an ISAM 104 before storing in the DRAM 102. These modifications can be either of the cell header, or of the prepend/postpend data attached to the cell. Updating of the cell header can also include an update of the CRC byte.

The output edit register 132 provides the means to modify the ATM cell contents at the last possible moment prior to outputting the cell. The output edit register provides data to an OR-type logic function, allowing the control interface and command decode 114 to set selected bits in the cell header or prepend/postpend data. If the cell header is updated, the corresponding CRC can also be updated using the output edit register.

Figure 2:
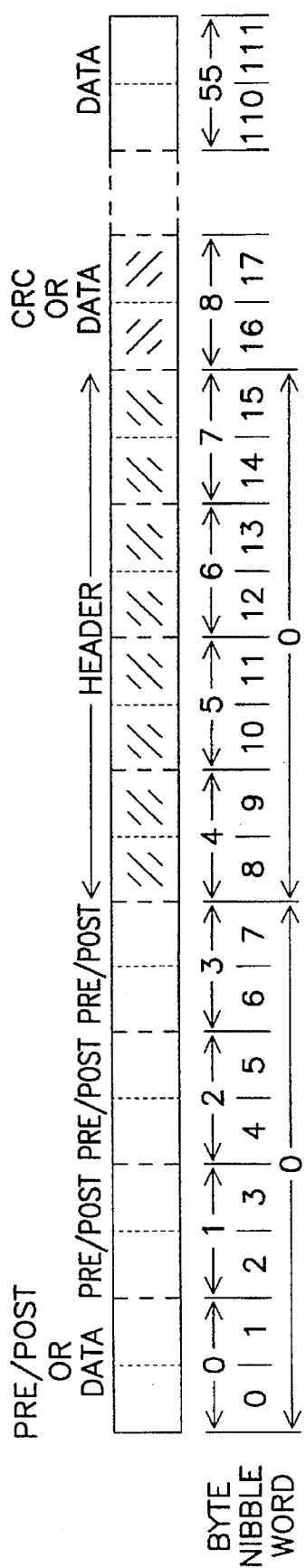
FIG. 2 is a 56 byte ATM cell having a specific byte assignment.
Figure 3:
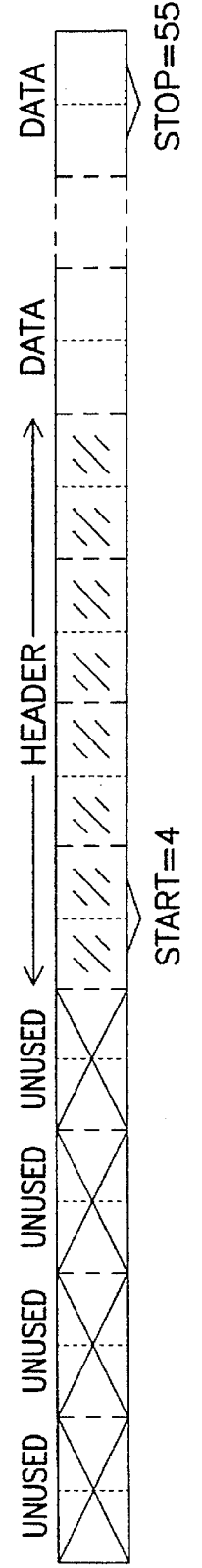
FIG. 3 is a 52 byte ATM cell having a specific byte assignment.
Figure 4:
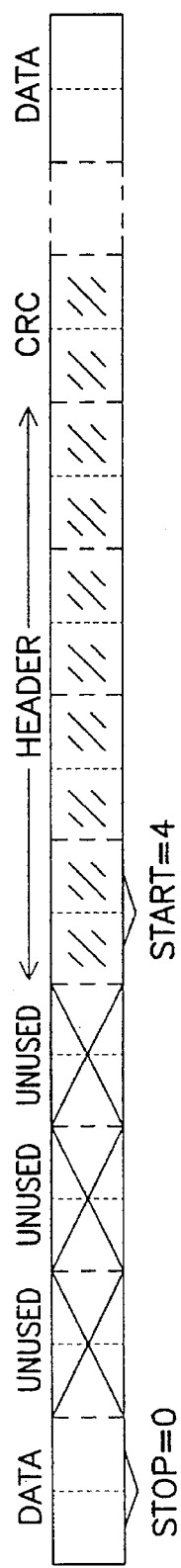
FIG. 4 is a 53 byte ATM cell having a specific byte assignment.

Editing support for various cell lengths is accomplished by defining the ISAM start and stop positions within the ISAM's 56 byte space. The start and stop pointers are loaded by the command interface and command control 114, and are set such that the cell header appears in bytes 4–7 of the ISAM. The CRC byte, if present, is always in byte 8 of the ISAM. FIG. 2 shows the ISAM space with the ATM cell header properly aligned. For the cases without any prepend/postpend data, FIG. 3 show the ISAM start pointer set to 4 and the ISAM stop pointer set to 55 if no CRC is present (making a 52 byte cell). Similarly, FIG. 4 shows the start pointer set to 0 if CRC is present (making a 53 byte cell).

There are different configurations for the ISAMs, each giving various mounts of prepended and postpended data. The values of start and stop positions for different configurations are given in Table 1. It will be understood that values other than these may also be used in a carefully designed non-ATM system.

TABLE 1

|  | W/O CRC | | With CRC | |
| --- | --- | --- | --- | --- |
|  | Start | Stop | Start | Stop |
| Without prepend/postpend data | 4 | 55 | 4 | 0 |
| 1 byte prepend | 3 | 55 | 3 | 0 |
| 1 byte postpend | 4 | 0 | 4 | 1 |
| 2 bytes prepend | 2 | 55 | 2 | 0 |
| 1 byte prepend & 1 byte postpend | 3 | 0 | 3 | 1 |
| 2 bytes postpend | 4 | 1 | 4 | 2 |
| 3 bytes prepend | 1 | 55 | 1 | 0 |
| 2 bytes prepend & 1 byte postpend | 2 | 0 | 2 | 1 |
| 1 byte prepend & 2 bytes postpend | 3 | 1 | 3 | 2 |
| 3 bytes postpend | 4 | 2 | 4 | 3 |
| 4 bytes postpend | 0 | 55 | | |
| 3 bytes prepend & 1 byte postpend | 1 | 0 | | |
| 2 bytes prepend & 2 bytes postpend | 2 | 1 | | |
| 1 byte prepend & 3 bytes postpend | 3 | 2 | | |
| 4 bytes postpend | 4 | 3 | | |

The OSAM start and stop address are separately configurable from the ISAM start and stop addresses. Thus, outgoing cells can have more bytes or fewer bytes than incoming cells. This feature provides the capability for adding or deleting prepended and postpended data bytes. The table of start and stop addresses is identical to that for the ISAMs given above in Table 1.

PROGRAMMABLE COUNTER OPERATION

Figure 5A:
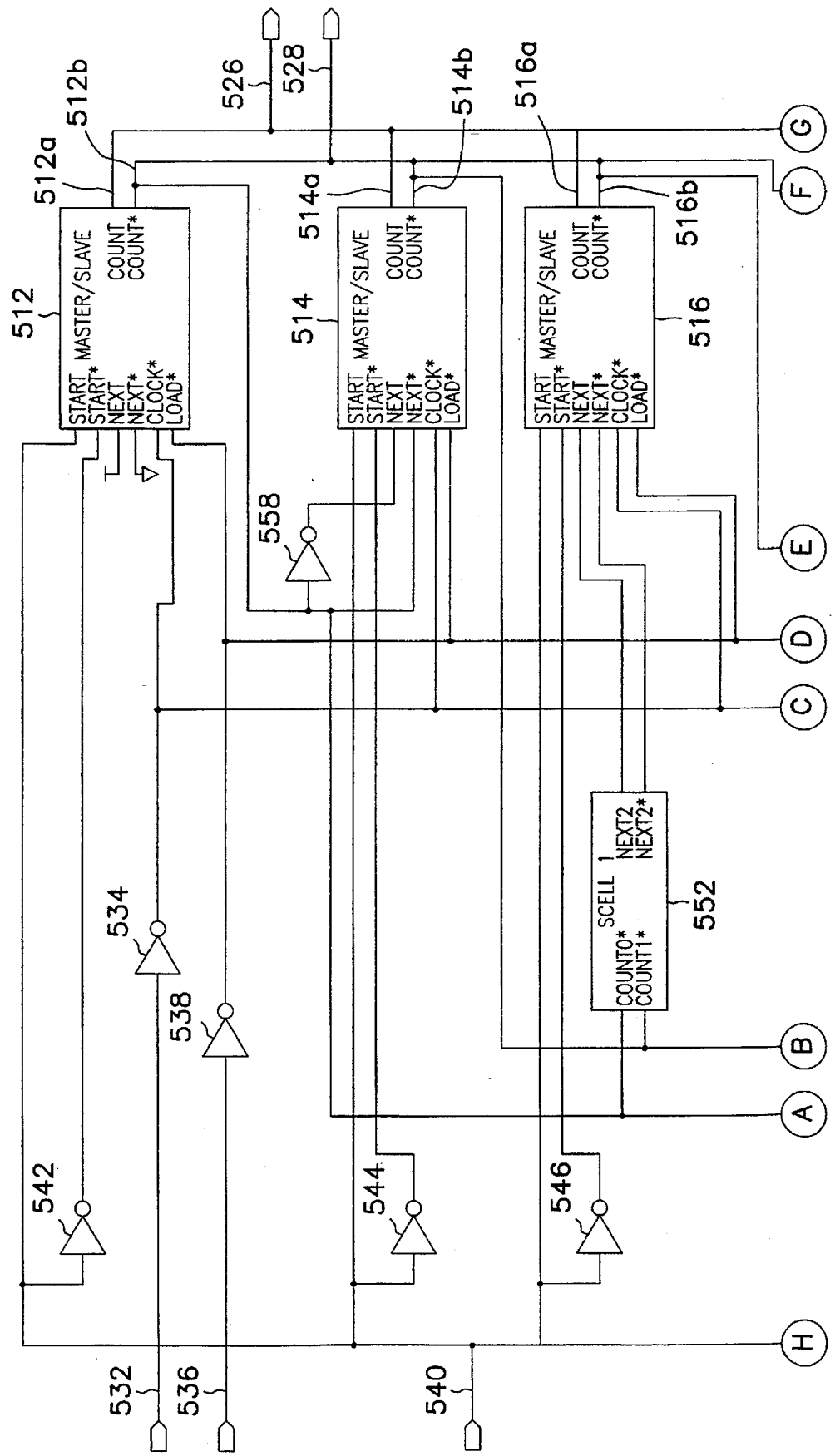
FIG. 5a is a schematic diagram illustrating the logic components of a 7-bit programmable counter partially in block form.
Figure 5B:
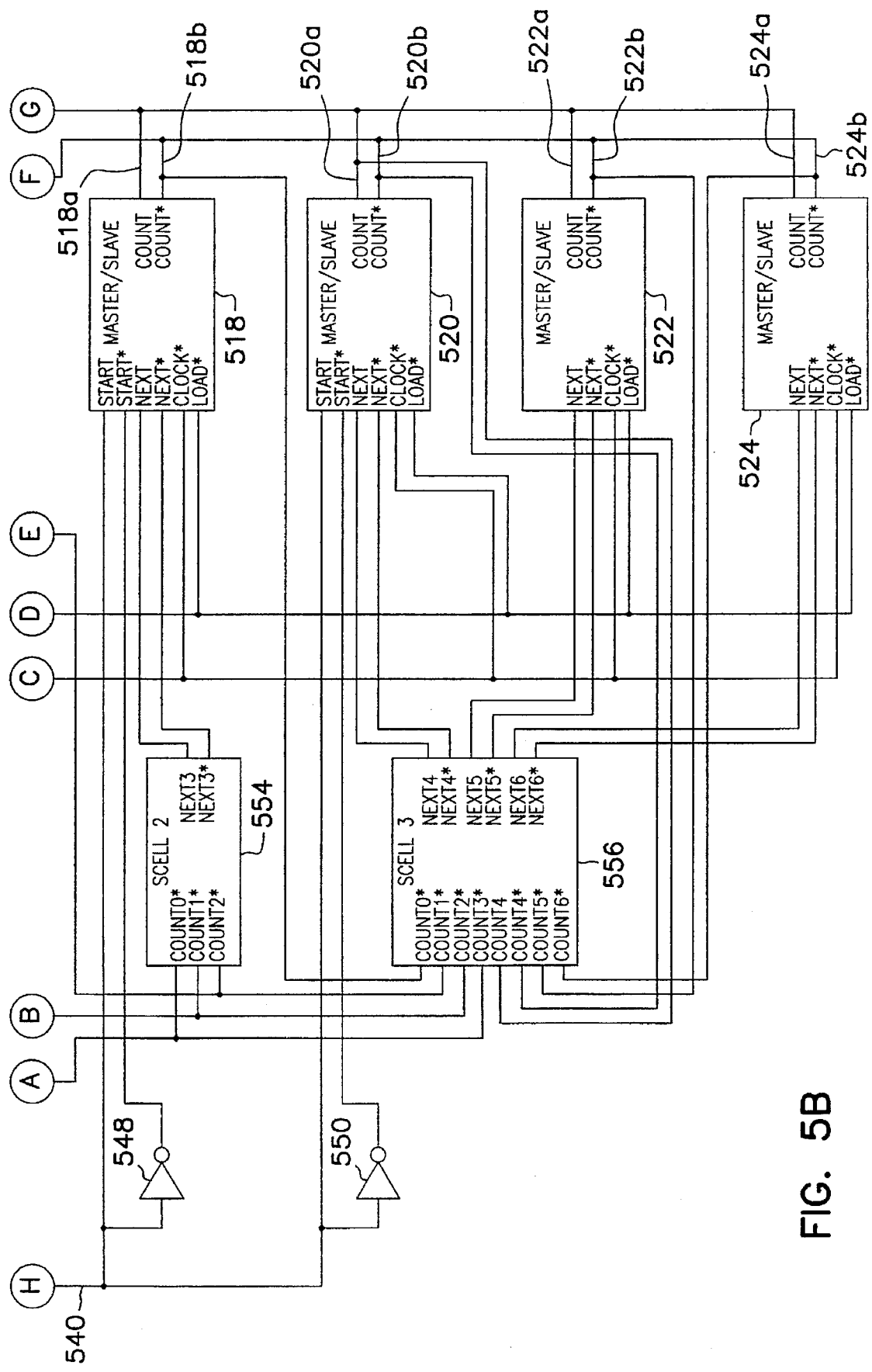

A programmable counter used in buffer/counter 116 and buffer/counter 108 is indicated generally at 510 in FIG. 5a and FIG. 5b. In the embodiment shown, seven digits of count value are available. The first digit or bit, "0" is provided by a master/slave latch 512, with the remaining digits "1" through "6" being provided by count circuits 514, 516, 518, 520, 522, and 524 respectively. The binary digit output and its complement for each latch 512 through 524 are coupled to two communicative lines numbered 512a, 512b, 514a, 514b, 516a, 516b, 518a, 518b, 520a, 520b, 522a, 522b, 524a, and 524b. Each line is numbered consistently with the latch from which it originates. The type of logic circuits may be CMOS, TTL, ECL, MOS, IIL or any other one of numerous families of digital integrated circuitry from which logic gates may be formed. In one embodiment, the lines comprise metalized paths on a silicon substrate. Further embodiments include copper wires, suitably doped silicon, infrared couplers, optical cable or any other means for communicating count related information. The latch outputs are combined into parallel connectors at 526 for the high or positive logic level count, and at 528 for the complement of the count.

Figure 6:
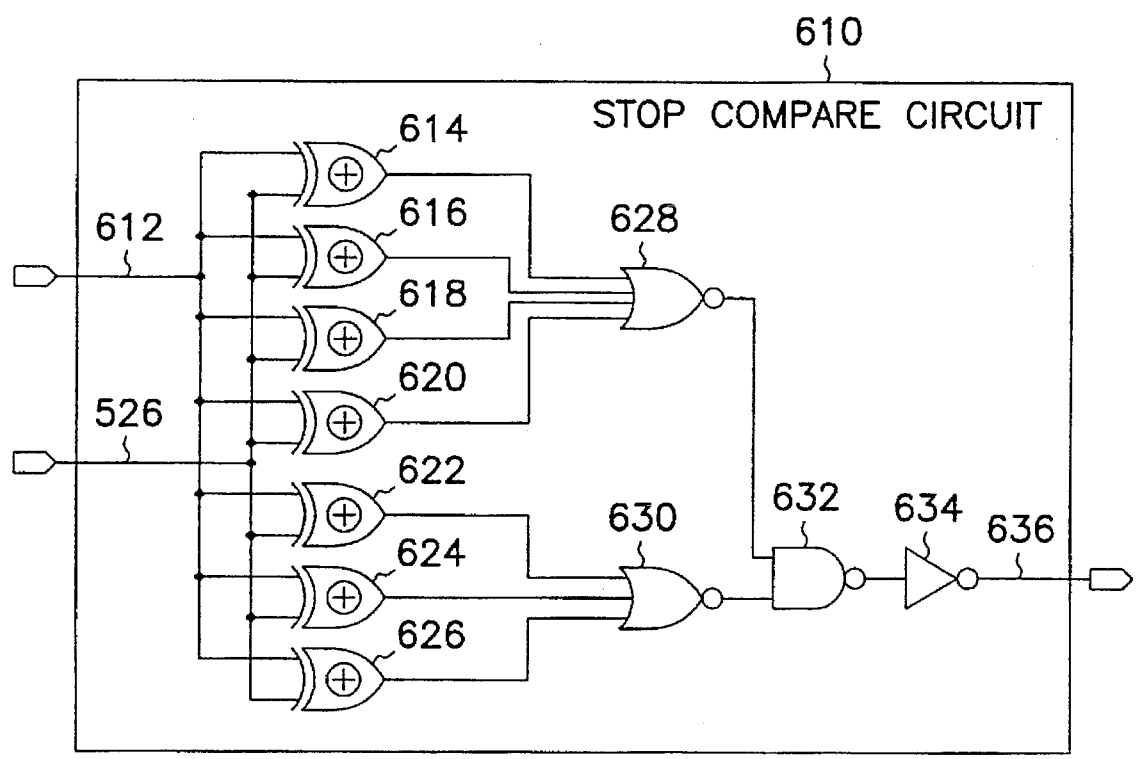
FIG. 6 is a schematic diagram illustrating the logic components of a stop compare circuit coupled to the counter of FIGS. 5a and 5b.

Each latch 512 through 524 is provided with a clock signal on line 532, inverted by an inverter 534 and a load signal on line 536, inverted by an inverter 538. In addition, each of five latches 512, 514, 516, 518, and 520 is provided with one of bits 0 through 4 respectively of a start signal indicated on line 540. The complement of each start signal bit is also provided via inverters 542, 544, 546, 548 and 550 to the five latches 512, 514, 516, 518 and 520 for redundancy. Each latch also receives a next signal and its complement to indicate the latch should change its count based on the count of lower order bits. Latch 512 receives fixed next signals which are shown in FIG. 6 as tied to high and low logic levels respectively. The count 0 and its complement from latch 512 is provided as the next signals for latch 514. Latch 614 will only increment its count 1 when latch 512 has counted back to 0. In turn, each successive latch is coupled in a manner described below to propagate the count as desired. Note that all logic levels may be inverted by standard design choice, and the supply of power is not explicitly shown, as it may be easily implemented by one skilled in the art.

The clock signal 532, load signal 536 and start signal 540 initiate the following functions. When the clock signal on line 532 pulses high, normal counting occurs. To load the start value into the latches, load pulses high. The first 5 bits loaded into the latches comprise the start signal 540 and the 6th and 7th bits are 0 in the present embodiment. In one preferred embodiment, the start signal comprises a bit for each of the latches. In a further preferred embodiment, the load, start and clock signals are provided by circuitry designed to receive and send packets of information, such as those found in ATM protocols.

The clock signal 532 transitions high for each half byte of the cell transferred, causing the count to increase in numerical value by 1. With 7 digits of count available, the potential count is 128. However, the count has been limited to 111 to accommodate a full cell of data at the peak cell size, as well as shorter cells without having to intervene to reset the counter or provide separate counters for each different cell length. The count is limited by means of scell blocks 552, 554 and 556 which receive count bits from selected latches and provide appropriate next signals to so limit the count. The scell circuitry is shown in further detail in FIGS. 9, 10 and 11 and discussed below. After the limit of 111 has been reached, the counter 510 recycles back to 0 and starts counting again.

The 7-bit count 26 of counter 510 is provided to a stop compare circuit indicated at 610 in FIG. 6. Also provided as an input is a 7-bit stop signal on line 612. Each respective bit position of the count 526 and stop 612 signals is compared by Exclusive OR gates 614, 616, 618, 620, 622, 624, and 626, NOR gates 628 and 630, and NAND gate 632. The output of NAND gate 632 is inverted by an inverter 634 to provide a match signal on line 636 indicative of whether the stop signal 612 matches the count signal 616. The match signal 636 is utilized to trigger the load signal on line 536 in FIG. 5, causing the value of the start signal on line 540 to be loaded into the latches. In operation, if any of the respective bits of the stop and count signals do not match, one of the Exclusive OR gates 614 through 626 provides a positive indication which is NORed by one of NOR gates 628 and 630, NANDed by NAND gate 632 and inverted to a non-positive indication of match by inverter 634. If all of the respective bits of the stop and count signals match, no positive indication is provided by the Exclusive OR gates, and a positive indication of match results on line 636. The end of each cell is identified by an input framing signal. If it is encountered prior to the stop signal, it is then known that there is an error in the cell. Parity data is also generated and stored in the DRAM to aid in checking cell integrity when the cell is transferred out of the DRAM.

Figure 7:
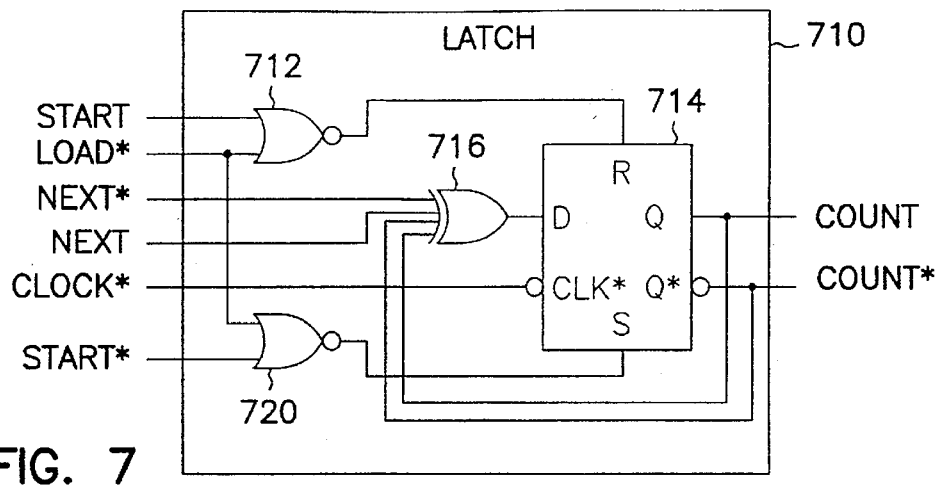
FIG. 7 is a schematic diagram illustrating the logic components providing lower order bits of the programmable counter of FIGS. 5a and 5b.

Further detail of the latches 512, 514, 516, 518 and 520 is shown in FIG. 7 generally at 710. Each of the latches receives the start signal from line 540 and its complement, the complement of the load signal from line 536, the complement of the clock signal and a next signal and its complement from various scells 552, 554 and 556, or as previously mentioned, a preceding latch, or from a source tied to a high or low logic level. The start signal and the complement of the load signal are provided to a NOR gate 712, whose output is provided to the reset pin of a latch device 714, which in mm provides a bit of the count and its complement. The reset pin will force the latch device 714 to provide a count of 0 when clocked. The count and its complement are fed back to the input of an Exclusive OR gate 716, which also receives the next signal and its complement as inputs. Gate 716 is coupled to the data input of latch device 714. The complement of the clock signal is provided to the clock pin of latch device 714 to cause it to toggle the count between high and low logic levels. A NOR gate 720 receives the complement of the load signal and the complement of the start signal and provides its result to the set pin of latch device 714. When the signal on the set pin is high, it causes latch device 714 to force the count to the level of the data input from Exclusive OR gate 716.

Figure 8:
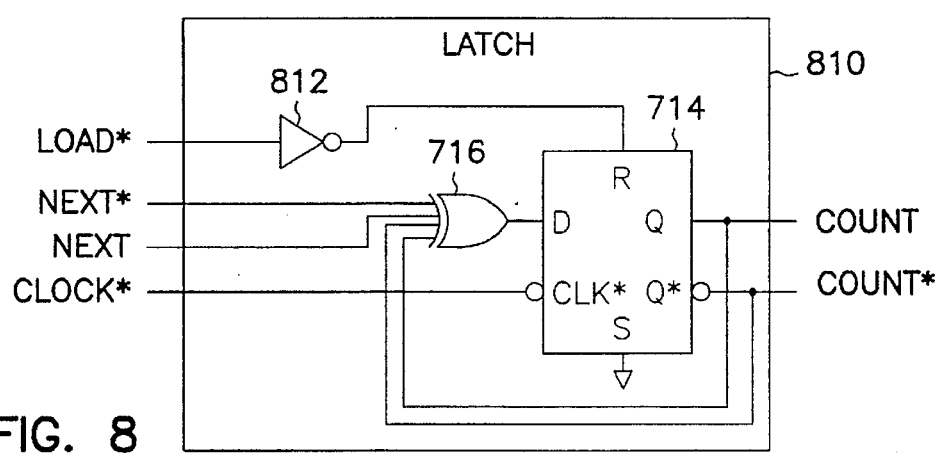
FIG. 8 is a schematic diagram illustrating the logic components providing higher order bits of the programmable counter of FIGS. 5a and 5b.

Further detail of the latches 522 and 524 is shown in FIG. 8 generally at 810. These latches are very similar in configuration and operation to latches 512 through 520 except that they are not provided start signals. The complement of the load signal is complemented again by an inverter and provided to the reset pin of latch device 814, which in turn provides a bit of the count and its complement. The count and its complement are fed back to the input of an Exclusive OR gate 816, which also receives the next signal and its complement as inputs. Gate 816 is coupled to the data input of latch device 814. The complement of the clock signal is provided to the clock pin of latch device 814 to cause it to toggle the count between high and low logic levels.

The bits of the next signal define the maximum count of the counter 510. The 0 bit of the next signal is provided to latch 512 via being coupled to logical 1, and its complement being coupled to logical 0, or high and low logic levels. This ensures that latch 512 will toggle between high and low in response to the clock signal absent set and reset signals. The 0 bit of the count and its complement produced by an inverter 558 are provided to latch 514 as bit 1 of the next signal. This ensures that latch 514 will only toggle its count output following a complete cycle of lower order bits of the count signal. The remaining bits of the next signals are provided to the latches 516 through 524 via scells 552, 554 and 556 which are now described in further detail, and function generally to keep the count sequential and provide a limit to the count such that the count returns to 0 when the limit is reached.

Figure 9:
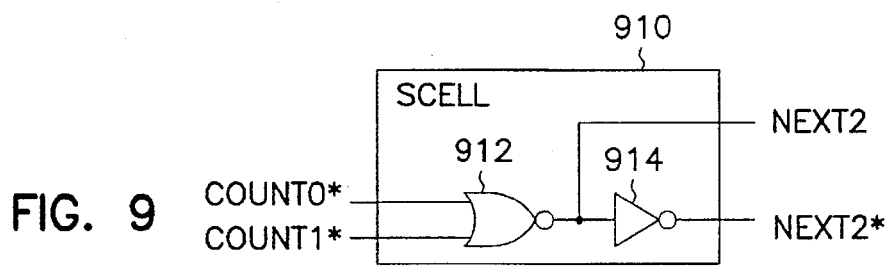
FIG. 9 is a schematic diagram illustrating the logic components controlling the sequencing of bit 2 of the programmable counter of FIGS. 5a and 5b.

Scell, or stop logic cell 552 is shown generally at 910 in FIG. 9. The various scells shown act as toggle controller which cause the latches to generate a 0 bit count based on a predetermined rollover value of the count. The complements of the 0 and one bits of the count from latches 512 and 514 are provided to a NOR gate 912. NOR gate 912 provides bit 2 of the next signal, and the output of an inverter 914 provides its complement to latch 516, as seen in FIG. 5a.

Figure 10:
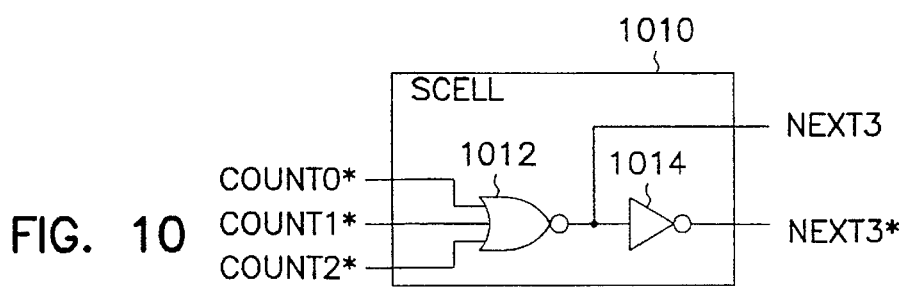
FIG. 10 is a schematic diagram illustrating the logic components controlling the sequencing of bit 3 of the programmable counter of FIGS. 5a and 5b.

Scell 554 is shown generally at 1010 in FIG. 10. The complements of the count bits 0, 1, and 2 from latches 512, 514 and 516 are provided as input to a NOR gate 1012. NOR gate 1012 provides bit 3 of the next signal, and the output of an inverter 1014 provides its complement to latch 518. Scell 554 ensures that count bit 3 is toggled only following a complete cycle of lower order bits of the count signal.

Figure 11:
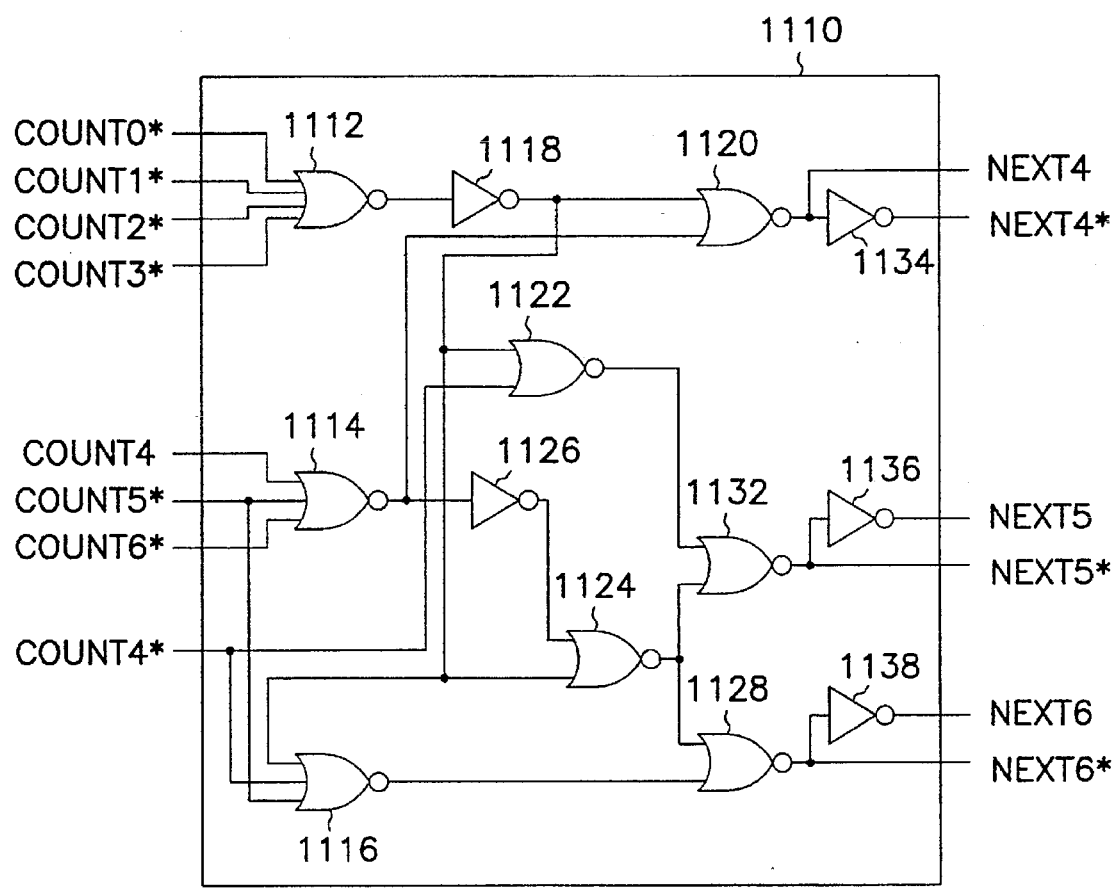
FIG. 11 is a schematic diagram illustrating the logic components controlling the sequencing of bits 4, 5 and 6 of the programmable counter of FIGS. 5a and 5b.
Figure 12:
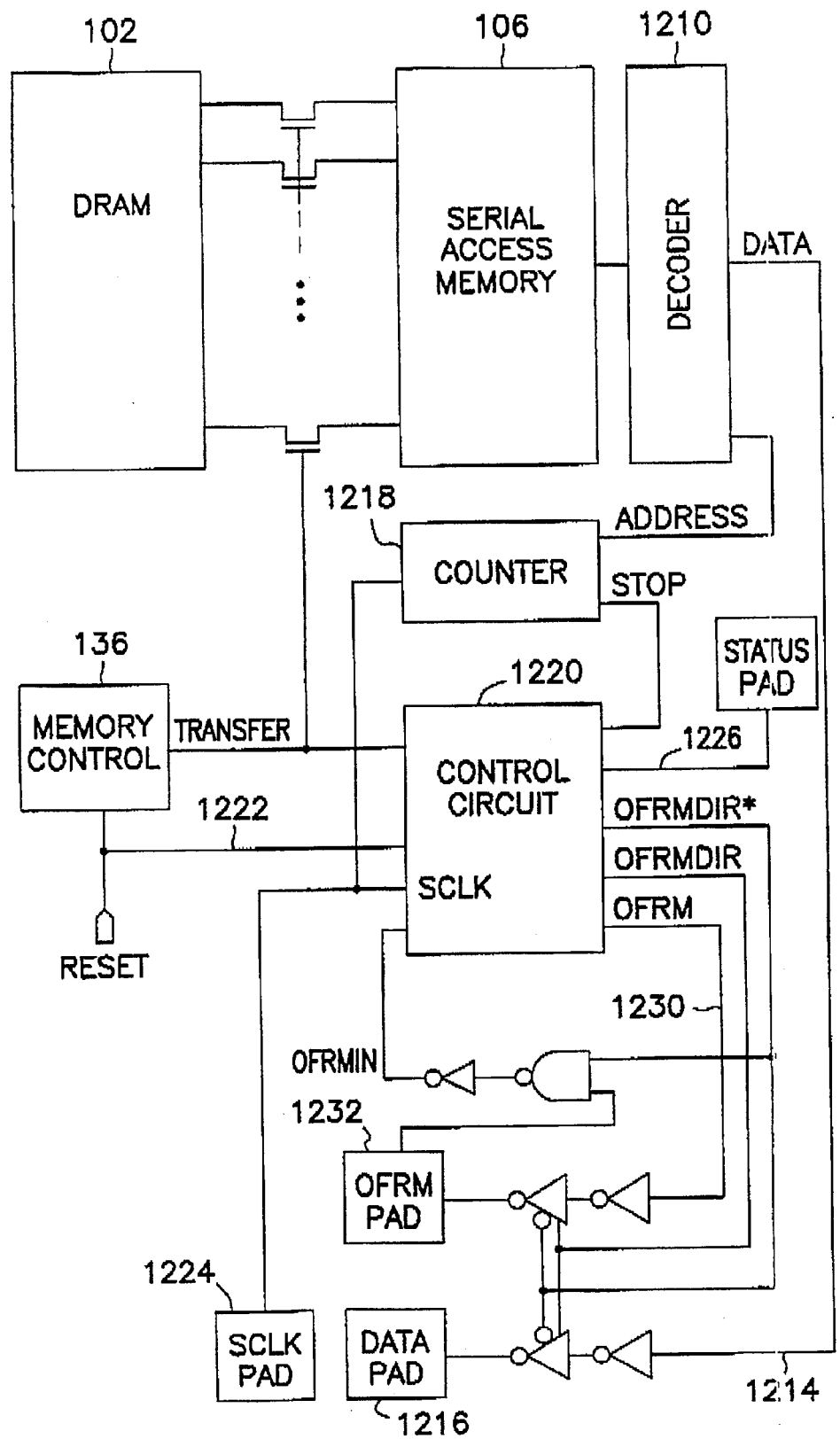
FIG. 12 is a block diagram of control circuitry associated with each output port of FIG. 1.

Scell 556 is shown generally at 1110 in FIG. 11. The complements of the count bits 0 through 6, and also the uncomplemented bit 4 are selectively provided as inputs to NOR gates 1112, 1114 and 1116 as indicated in FIG. 11. The uncomplemented bit 4 corresponds to the 16 position in decimal arithmetic. It is used to reduce the count of 128, which could normally be provided with 7-bits of counting space, to 112, which is most useful in ATM cell processing. NOR gate 1112 receives the complement of counts 0, 1, 2, and 3 and provides its output to an inverter 1118. The output of inverter 1118 is provided as input to a NOR gate 1120, a NOR gate 1122 and a NOR gate 1124. NOR gate 1114 receives count bit 4, and the complement of count bits 5 and 6 from respective latch outputs. It provides its output to NOR gate 1120 and to an inverter 1126. NOR gate 1116 also receives the complement of count bits 4 and 5 from the latches and provides its output to a NOR gate 1128. The complement of count bit 4 is also provided as inputs to NOR gate 1122 and NOR gate 1120. The output of NOR gate 1122 is provided to a NOR gate 732. NOR gate 724 provides its output to both NOR gate 1128 and NOR gate 1132. NOR gate 1120 generates the 4th bit of the next signal, as well as its complement via an inverter 1134. NOR gate 1132 provides the complement of the 5th bit of the next signal, which is also inverted by an inverter 1136. NOR gate 1128 provides the complement of the 6th bit of the next signal as its output, which is also inverted by an inverter 1138.

Scell 1110 operates to provide the 4th, 5th and 6th bits of the next signal in a manner that causes the count to increase sequentially up to the decimal value of 111, corresponding to the binary value of the count signal of "1101111." As can be seen, only bit number 4, remembering that the first position is the 0 bit, has the value of "0." This causes the values at the outputs of the NOR gate 1112 to be high, NOR gate 1114 to be high and NOR gate 1116 to be low. Propagating these values further through scell 1110, results in the following values at the outputs of each of the gates: inverter 1118—low; NOR 1122—low; inverter 1126—low, NOR 1120—low, NOR 1124—high, NOR 1132—low and NOR 1128—low. As can be seen, next bits 5 and 6 are high, triggering a toggle of the corresponding count bits to 0, but next bit 4 is low, causing the count bit 4 to remain at 0. Since the remaining next bits provided by other connections and scells previously described also indicate that respective count bits should be toggled, the count toggles to 0, rolling over after a count value of decimal 111. As will be obvious to those skilled in the art, other count rollover values are easily obtainable using the same technique.

OUTPUT PORT SERIALIZATION

Control circuitry associated with each output serial access memory port, OSAM 106 is shown in further detail in FIG.

12. A decoder 1210 provides a cell of data from SAM 106 along a 4-bit bus 1214 to a data pad 1216 which is coupled to an external channel or bus. A counter 1218 as previously described having start and stop addresses, provides the sequencing for decoder 1210 to provide a cell of ATM data in the desired sequence. A control circuit 1220 is coupled to the counter, memory controller 136, a RESET line 1222, and an SCLK clock pad 1224, and provides a STATUS signal on line 1226. Control circuit 1220 also provides an OFRM (output frame) signal on line 1230, which in turn is coupled to an OFRM pad 1232 for connecting to other circuitry. In general, the above control circuitry serves to provide a self-queuing mechanism for the output port it controls. The counter 1218 counts with other counters associated with other output ports that are all coupled to the same bus or channel. In that manner, each of the output ports are synchronized, and ready to transmit a cell during the next available period as described in further detail below.

Figure 13:
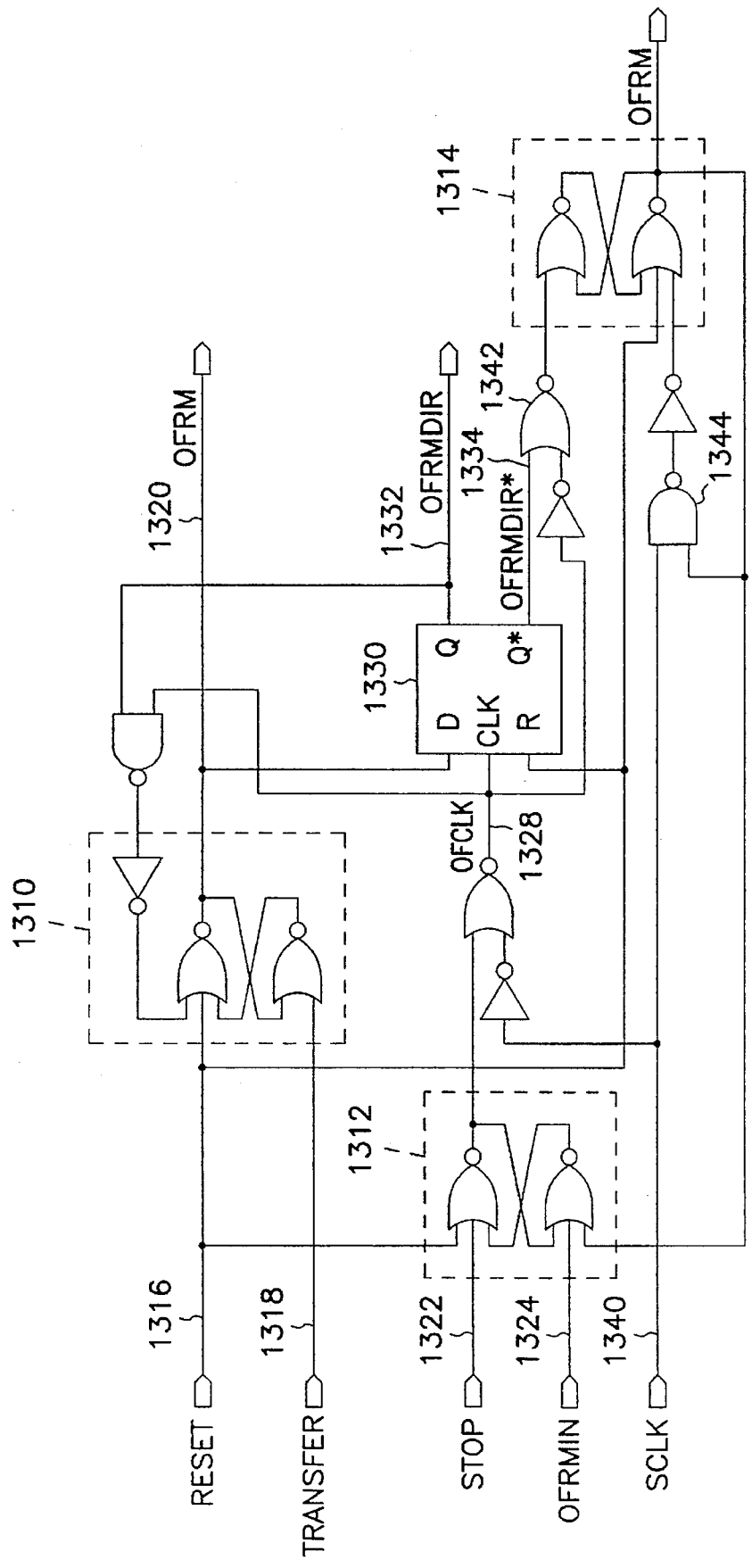
FIG. 13 is a schematic diagram illustrating the logic components of the control circuitry of FIG. 12.

In FIG. 13, the control circuit 1226 is shown in more detail. Three latches, a STATUS latch 1310, a STOP latch 1312 and an OFRM latch or output frame signal generator 1314 operate to provide the signals associated with their names. A RESET signal provided on line 1316 is provided to each of the latches to reset them. A TRANSFER signal on line 1318 is provided to the STATUS latch 1310 to indicate to the control circuit that the output port has data to output to the channel. It causes a STATUS line 1320 to be raised.

The STOP latch 1312 receives a STOP signal on line 1322, the RESET signal 1316, an OFRMIN signal 1324, and an OFRM signal on line 1326 which is the output of the OFRM latch 1314 and also corresponds to the START signal on line 540. OFCLK latch 1312 provides the OFCLK signal on line 1328. A flip flop 1330 functions as a data transfer enabler and provides an OFRMDIR signal on a line 1332, and its complement on line 1334. The OFRMDIR signals are used to control provision of data and the OFRM signal on the pads 1216 and 1232.

In operation, control circuit 1226 allows for a much simpler external controller. The controller only needs to check the STATUS signal of all of the ports on a bus or channel. If they are empty, meaning they do not contain a cell to be transferred to the bus, or one port is currently transferring data to the bus, as signified by STATUS=0, then it may transfer data into a port for later transfer onto the channel. If one port is full, STATUS=1, then that port is waiting to transmit data. The control circuit is first reset by pulsing RESET on line 1316 hi, which sets it into input mode (OFRMDIR=0) and causes OFCLK 1328 to clock with the system clock SCLK on line 1340. If no chip has yet had a transfer, all the ports coupled to the channel will have OFRMDIR=0, and the OFCLK signal enabled to clock with SCLK. A transfer command from the switch is signified by TRANSFER 1318 pulsing high, which sets the STATUS latch 1310, then OFCLK clocks STATUS into the flip flop 1330 setting OFRMDIR 1332 high, which feeds back to reset the STATUS latch. OFRMDIR* feeds into a NOR gate 1342, which sets the OFRM latch 1314 high. OFRM is then set low on the next SCLK due to feedback through a NAND gate 1344, and then sets the OFCLK latch so that OFCLK will not fire. A new TRANSFER initiated by the external controller stays in the STATUS latch until OFCLK is re-enabled. The OFRM hi will start the counter going in all of the ports, but only the port with OFRMDIR hi will have it's data and OFRM outputs enabled to allow cell data to be clocked out to the channel. When the control circuit then outputs OFRM hi for one cycle, it disables the OFCLK on the other ports (OFRMIN pulses hi), and starts their counters. When all of the ports reach the last bit of data (STOP pulses hi), then the OFCLK is enabled again, so the port that was in output mode will clock in a 0, setting OFRMDIR=0, while the port with STATUS set by the external controller clocks that in, setting it's OFRMDIR hi and allowing it to transfer data starting on the next available cycle.

Figure 14:
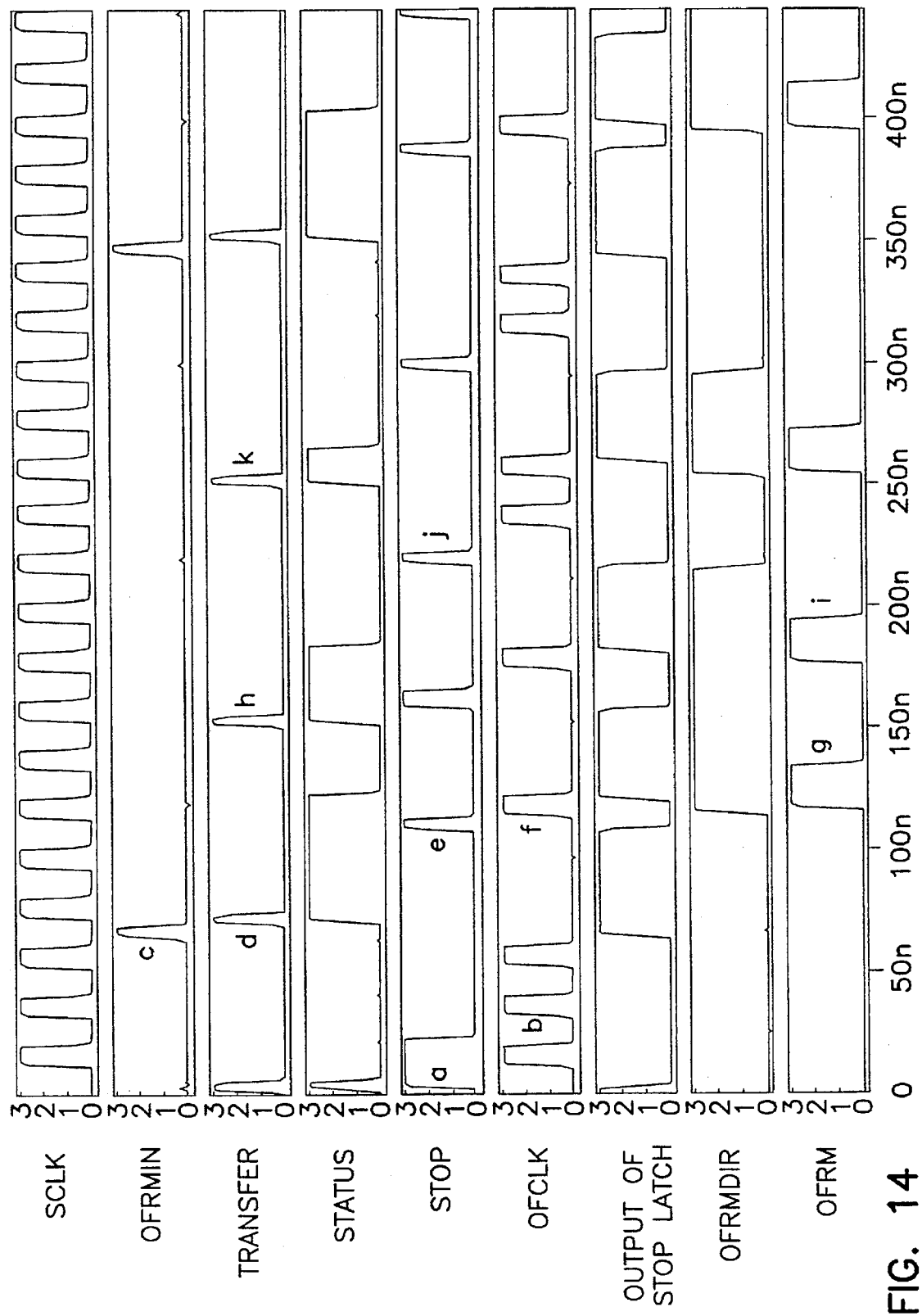
FIG. 14 is a timing diagram illustrating the timing of signals associated with the logic components of FIG. 13.

A wave form timing diagram in FIG. 14 shows the logic levels of data transfers for one port. The vertical scale is volts, and voltage transitions of selected signals are labeled with letters which correspond to the following description. Time is represented on the horizontal axis in nanoseconds. The voltages and time scales are merely representative of one embodiment of the invention. Other cycle times and logic levels will be apparent to those skilled in the art. Cycle times are generally decreasing with improvements in switching times of integrated circuits. At (a), RESET fires to clear all of the latches. While STOP fires in the wave form, it does not fire in the circuit. The port is now in standby. The channel is free, and no transfer has been done, so OFCLK follows SCLK as indicated at (b). When another port from any chip attached to the channel has a cell ready to be transferred onto the channel, it drives it's OFRM hi, causing OFRMIN to pulse hi at (c), keeping OFCLK low. The TRANSFER signal fires at (d), setting STATUS hi.

In order to conveniently represent the wave forms, an arbitrary cell size of 3 clocks long has been selected. As described above, the cell size is expressed in bytes, and transferred in nibbles, generally taking up to 112 cycles to transfer onto the bus. A cell size of three clocks allows convenient compression of the signal transitions to fit nicely within the bounds of the FIG. After two SCLK's, STOP fires at (e), signalling that the bus will be free on the next SCLK, allowing cell transfers to take place with no wasted clock cycles between transfers. This in turn, frees OFCLK at (f) to fire, clocking in the hi STATUS and setting OFRMDIR hi, and driving it's OFRM signal hi, which then feeds back and reset the STATUS latch and holds OFCLK low again. On the next SCLK, the OFRM signal resets low at (g). While the switch is still outputting the first cell of data, another transfer is done to the same chip, raising TRANSFER hi at (h), which causes STATUS to go hi. This causes OFRM to go hi again after STOP resets the latch, allowing OFCLK to clock in the new STATUS and cause another OFRM hi at (i). At (j), STOP is reached, but no transfer has been done, so the OFCLK clocks along with SCLK until (k), where another transfer is done.

Figure 15:
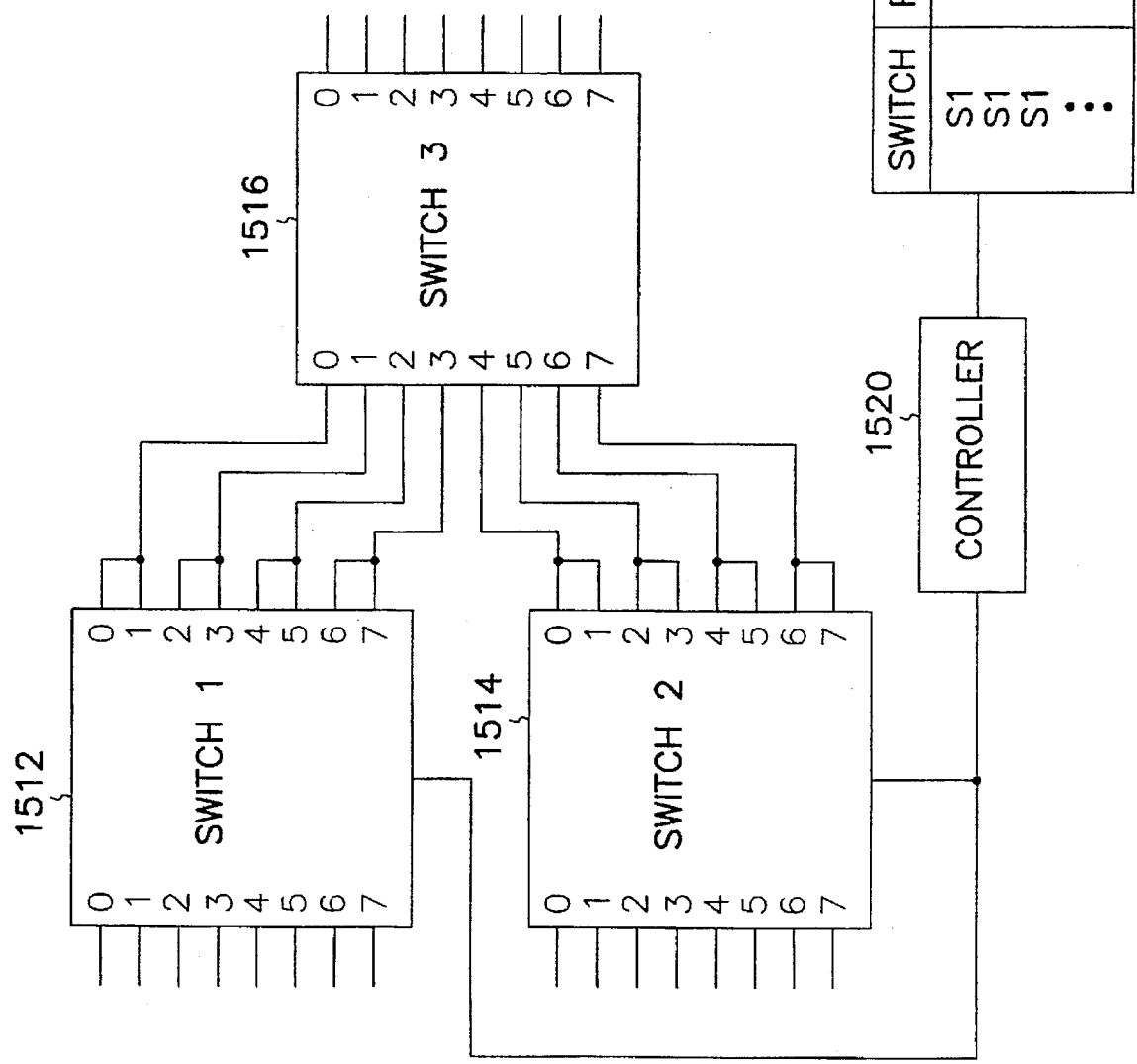
FIG. 15 is a schematic block diagram illustrating the connection of multiple multi-port switches of FIG. 1.

One configuration of multiport serialized switches is show in FIG. 15. In this configuration, 16 input ports from a pair of switches indicated at 1512 and 1514 are coupled through their output ports to a third switch 1516 which provides buffering, and conversion to four output channels. Adjacent output ports of switches 1512 and 1514 are tied together, and then coupled to the input ports of switch 1516. An external controller 1520, as referenced in the descriptions of different parts of the ATM switch above is bidirectionally coupled to switches 1512 and 1514. The external controller 1520 keeps track of the which ports are coupled to which channels in order to ensure that only one port per channel is requested to transfer a cell of data at any particular time. The controller references a table indicated at 1522 which identifies the switch, its ports, and which channel each port is coupled to in order for the controller to ensure that it only initiates a transfer in one port at a time.

Figure 16:
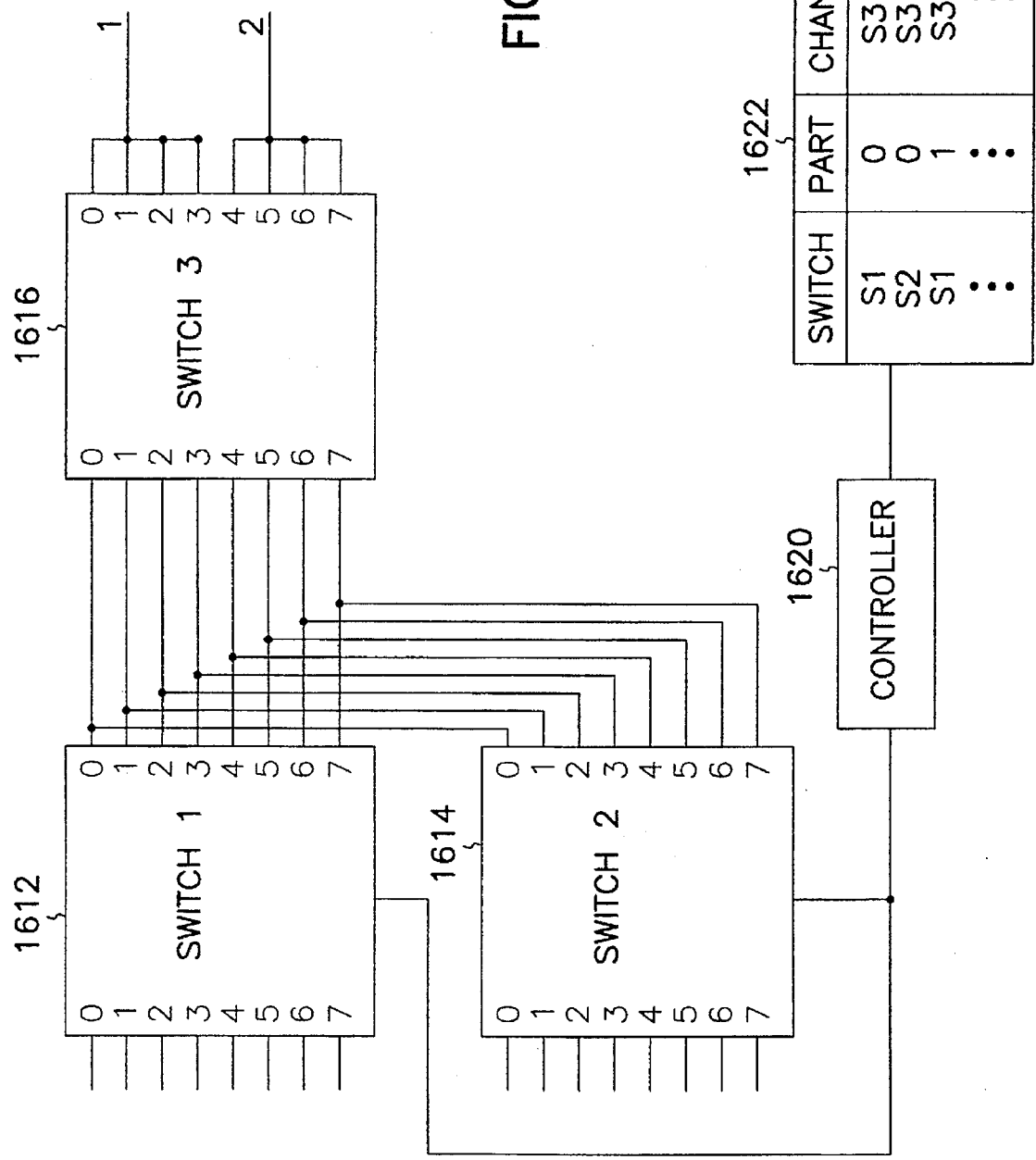
FIG. 16 is a schematic block diagram illustrating a further embodiment for connection of multiple multi-port switches of FIG. 1.

A further configuration of multiport serialized switches is shown in FIG. 16. This time, three switches, 1612, 1614 and 1616 are coupled to allow the transfer of ATM cells from any of 16 input channels coupled switches 1612 and 1614 to either of 2 output channels coupled to switch 1616. An external controller 1620 keeps track of the channel assignments for switches 1612 and 1614 in table 1622.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A programmable counter comprising:

multiple latches for providing a count output;

a first circuit for providing a start count value coupled to said latches;

a second circuit for providing a stop count value coupled to said latches;

a third circuit coupled to the latches for providing a maximum count value to said latches; and, a compare circuit coupled to the second circuit and the latches for comparing the count with the stop count.

2. The programmable counter of claim 1 wherein the third circuit comprises a toggle controller for receiving the count value and selectively providing toggle control signals to inputs of the latches.

3. The programmable counter of claim 2 wherein the toggle controller is provided the count from the latches and further provides a toggle control signal to each latch causing each latch to generate a 0 bit count based on a predetermined rollover value of said count.

4. The programmable counter of claim 3 wherein the rollover value of said count is decimal 111.

5. The programmable counter of claim 2 wherein the latches further comprise circuitry for resetting the value of the count to the start value upon reaching the stop count.

6. The programmable counter of claim 1 wherein the latches further comprise circuitry for resetting the value of the count to the start value upon reaching the stop count.

7. The programmable counter of claim 1 wherein each latch corresponds to one bit of a 7-bit count value.

8. A programmable counter comprising:

multiple latches for providing a count output;

a first circuit for providing a start count value coupled to said latches;

a second circuit for providing a stop count value coupled to said latches;

a compare circuit coupled to the second circuit and the latches for comparing the count with the stop count to provide a match indication causing the latches to be reset.

9. A method of counting implemented by digital logic circuitry comprising the following steps:

limiting the count to a maximum count value;

providing a start count value;

providing a stop count value which may be less than the start count value;

counting sequentially from said start count value;

resetting the count to 0 upon reaching the maximum count value; and continuing to count from 0 until the stop count value is reached.

* * * * *